(12) United States Patent
Matsunaga et al.

(10) Patent No.: US 12,345,913 B2
(45) Date of Patent: Jul. 1, 2025

(54) OPTICAL WAVEGUIDE PACKAGE AND LIGHT SOURCE MODULE

(71) Applicant: KYOCERA Corporation, Kyoto (JP)

(72) Inventors: Shougo Matsunaga, Kirishima (JP); Yoshiaki Itakura, Aira (JP); Hiroshi Matsumoto, Kirishima (JP)

(73) Assignee: KYOCERA CORPORATION, Kyoto (JP)

( * ) Notice: Subject to any disclaimer, the term of this patent is extended or adjusted under 35 U.S.C. 154(b) by 0 days.

(21) Appl. No.: 18/714,523

(22) PCT Filed: Nov. 30, 2022

(86) PCT No.: PCT/JP2022/044163
§ 371 (c)(1),
(2) Date: May 29, 2024

(87) PCT Pub. No.: WO2023/100927
PCT Pub. Date: Jun. 8, 2023

(65) Prior Publication Data
US 2025/0116806 A1   Apr. 10, 2025

(30) Foreign Application Priority Data
Nov. 30, 2021   (JP) .................................. 2021-194865

(51) Int. Cl.
*G02B 6/00*   (2006.01)
*F21V 8/00*   (2006.01)

(52) U.S. Cl.
CPC .................................. *G02B 6/0073* (2013.01)

(58) Field of Classification Search
CPC ... G02B 6/122; G02B 6/12004; G02B 6/0073
See application file for complete search history.

(56) References Cited

U.S. PATENT DOCUMENTS 5,093,884 A * 3/1992 Gidon .................... G02B 6/125
385/32
5,802,222 A * 9/1998 Rasch ................ G02B 26/0808
385/9

(Continued)

FOREIGN PATENT DOCUMENTS

JP   5-72432 A   3/1993
JP   08110446 A *  4/1996

(Continued)

*Primary Examiner* — Gerald J Sufleta, II
(74) *Attorney, Agent, or Firm* — Volpe Koenig

(57) ABSTRACT

An optical waveguide package includes a substrate including a first surface, a cladding layer on the first surface and including a facing surface facing the first surface and an opposite surface opposite to the facing surface including a recess, multiple element mount portions in the recess, and a core in the cladding layer. The core includes multiple light incident portions each including an incident end face located at an inner side surface of the recess, a merging portion in which the multiple light incident portions merge, and a light emission portion located downstream from the merging portion and including an emission end face located at an outer side surface of the cladding layer. The first surface includes an exposed portion at least lateral to the merging portion in a plan view.

10 Claims, 7 Drawing Sheets

(56) References Cited

U.S. PATENT DOCUMENTS

| | | | |
|---|---|---|---|
| 7,116,880 B1 | 10/2006 | Liu et al. | |
| 11,621,538 B2* | 4/2023 | Yagi | H01S 5/34306 |
| | | | 372/20 |
| 2010/0021107 A1* | 1/2010 | Naruse | G02B 6/4201 |
| | | | 385/14 |
| 2019/0214784 A1* | 7/2019 | Yamamoto | H01L 23/12 |
| 2019/0296520 A1* | 9/2019 | Miyata | H01S 5/1032 |
| 2019/0372302 A1* | 12/2019 | Miyata | H01S 5/02255 |
| 2021/0392308 A1* | 12/2021 | Huebel | H04N 9/3164 |
| 2021/0405292 A1* | 12/2021 | Saito | G02B 6/13 |
| 2022/0390689 A1 | 12/2022 | Itakura | |
| 2024/0255828 A1* | 8/2024 | Kikukawa | G02F 1/05 |

FOREIGN PATENT DOCUMENTS

| | | | |
|---|---|---|---|
| JP | 9-5548 A | | 1/1997 |
| JP | 10308555 A | * | 11/1998 |
| JP | 2001-174655 A | | 6/2001 |
| JP | 2006-267385 A | | 10/2006 |
| JP | 2007328201 A | * | 12/2007 |
| JP | 2008-20715 A | | 1/2008 |
| JP | 2015-87509 A | | 5/2015 |
| JP | 2017187719 A | | 10/2017 |
| WO | 2017090333 A1 | | 6/2017 |
| WO | 2020/175236 A1 | | 9/2020 |
| WO | 2021/065948 A1 | | 4/2021 |

* cited by examiner

OPTICAL WAVEGUIDE PACKAGE AND LIGHT SOURCE MODULE

TECHNICAL FIELD

The present disclosure relates to an optical waveguide package and a light source module.

BACKGROUND OF INVENTION

A known optical waveguide is described in, for example, Patent Literature $1_a$.

CITATION LIST

Patent Literature

Patent Literature 1: Japanese Unexamined Patent Application Publication No. 10-308555

SUMMARY

In an aspect of the present disclosure, an optical waveguide package includes a substrate including a first surface, a cladding layer on the first surface and including a facing surface facing the first surface and an opposite surface opposite to the facing surface including a recess, a plurality of element mount portions in the recess, and a core in the cladding layer. The core includes a plurality of light incident portions each including an incident end face located at an inner side surface of the recess, a merging portion in which the plurality of light incident portions merge, and a light emission portion located downstream from the merging portion and including an emission end face located at an outer side surface of the cladding layer. The first surface includes an exposed portion at least lateral to the merging portion in a plan view.

In an aspect of the present disclosure, a light source module includes the above optical waveguide package and a plurality of light emitting elements each mounted on a corresponding element mount portion of the plurality of element mount portions.

BRIEF DESCRIPTION OF THE DRAWINGS

The objects, features, and advantages of the present disclosure will become more apparent from the following detailed description and the drawings.

DESCRIPTION OF EMBODIMENTS

Various devices such as light source modules and optical circuits that emit light of merged light beams emitted from multiple light emitting elements have been proposed as described in Patent Literature 1. Such devices each include an optical waveguide including a cladding located on a main surface of a substrate and a core located in the cladding.

In such known devices, light leaking from the core or entering the cladding from the ambient environment may be stray light and emitted through an output end of the optical waveguide. This may lower the quality of emitted light.

An optical waveguide package and a light source module according to one or more embodiments of the present disclosure will now be described with reference to the accompanying drawings. The drawings used herein are schematic and may not be drawn to scale relative to the actual size of each component. In embodiments of the present disclosure, merging includes, in addition to superimposition of light beams with different wavelengths, merging of light beams guided to their respective optical channels and emitted through their respective emission end faces in, for example, a lens. Although the optical waveguide package and the light source module according to one or more embodiments of the present disclosure may be oriented with any sides being upward or downward, the optical waveguide package and the light source module herein are defined using the perpendicular coordinate system (X, Y, and Z) for convenience, in which the positive Z-direction is upward, and directional terms such as an upper surface or a lower surface is used accordingly. X-direction may be referred to as a first direction or a length direction. Y-direction may be referred to as a second direction or a width direction. Z-direction may be referred to as a third direction or a height direction.

Figure 1:
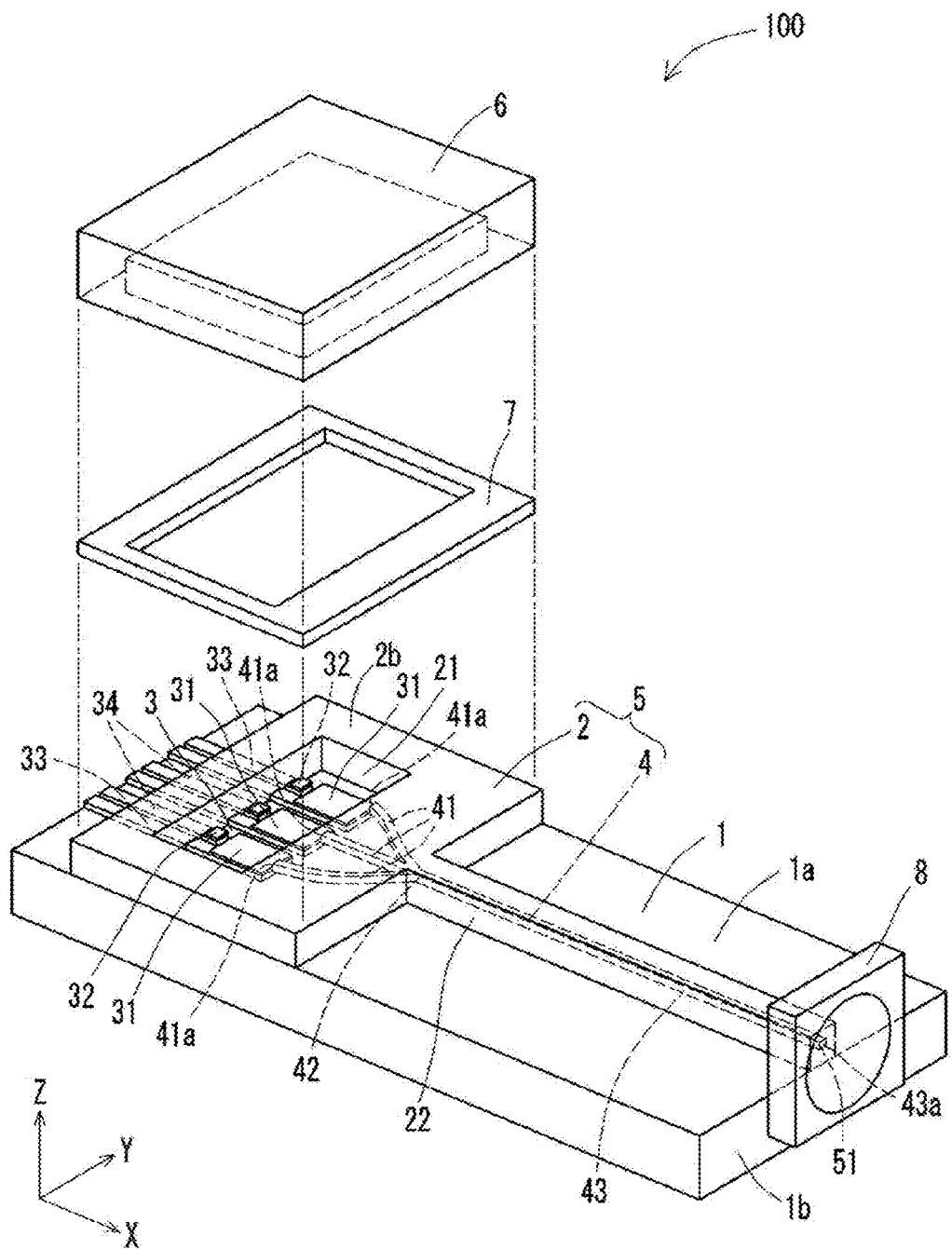
FIG. 1 is an exploded perspective view of an optical waveguide package according to one embodiment of the present disclosure.
Figure 2:
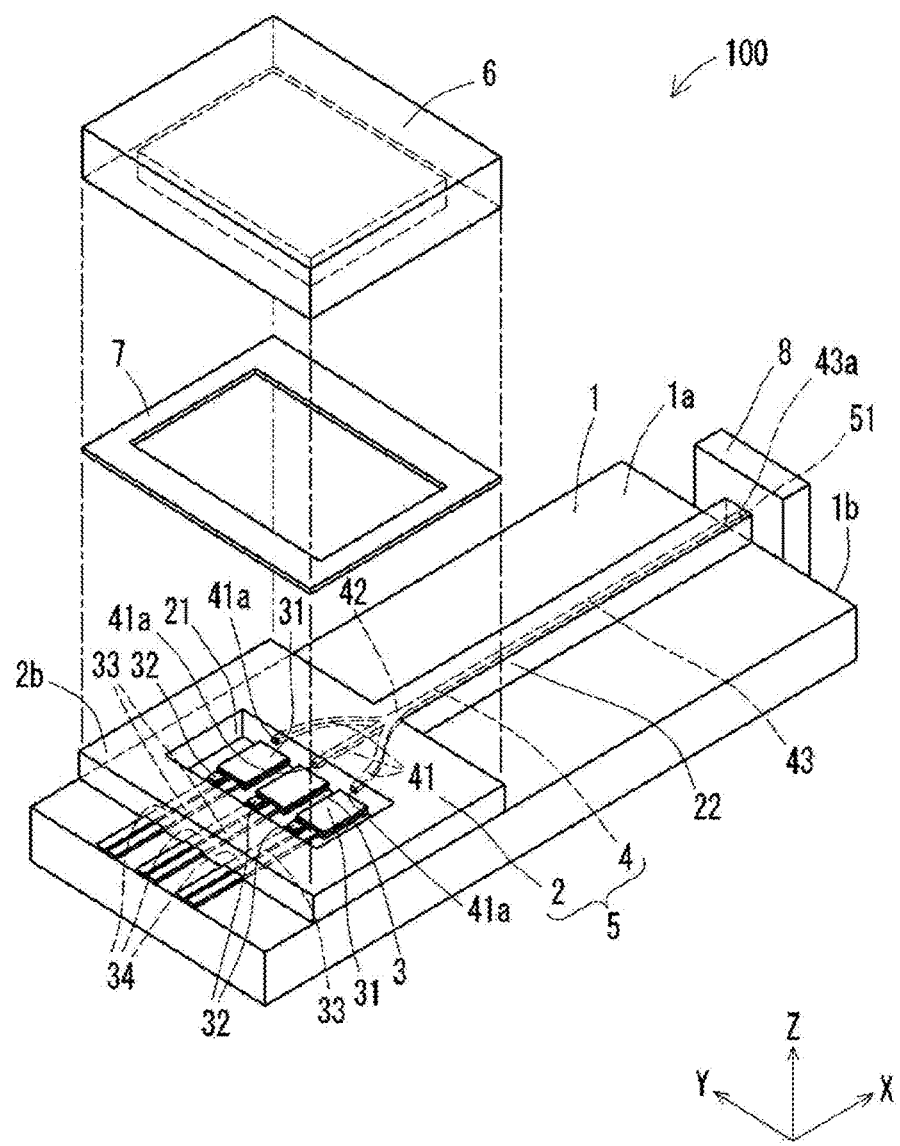
FIG. 2 is an exploded perspective view of the optical waveguide package according to the embodiment of the present disclosure as viewed in a direction different from the direction in FIG. 1.
Figure 3:
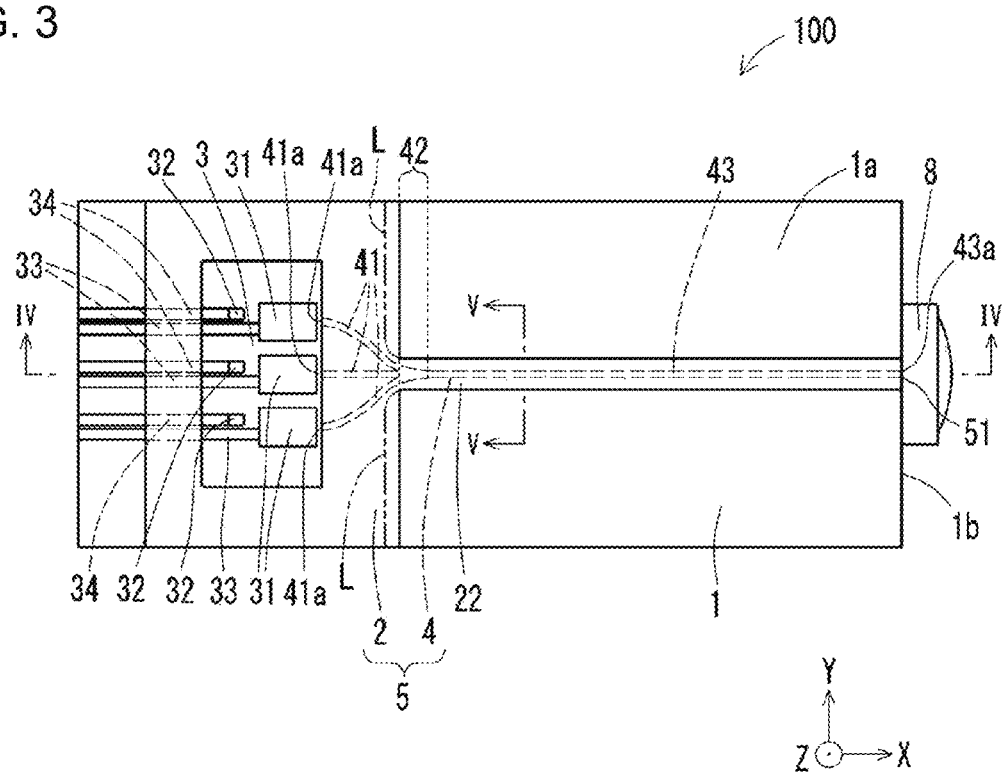
FIG. 3 is a plan view of the optical waveguide package in FIG. 1.
Figure 4:
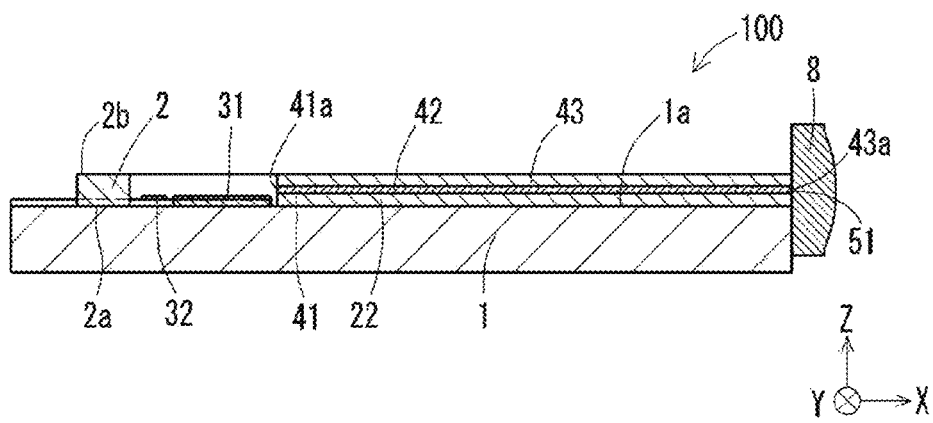
FIG. 4 is a cross-sectional view taken along line IV-IV in FIG. 3.
Figure 5:
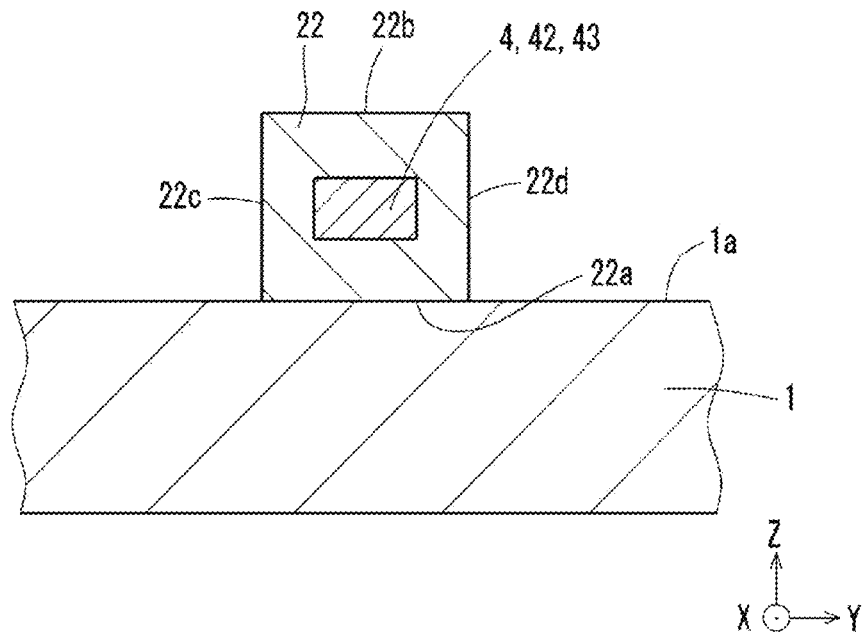
FIG. 5 is an end view taken along line V-V in FIG. 3.
Figure 6:
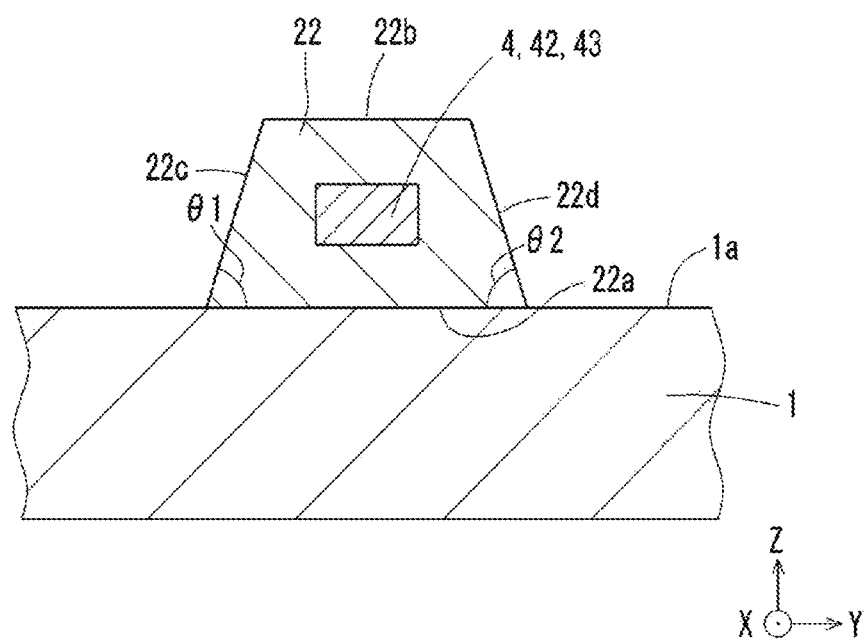
FIG. 6 is an end view of an optical waveguide package according to a variation of the optical waveguide package in FIG. 1.
Figure 7:
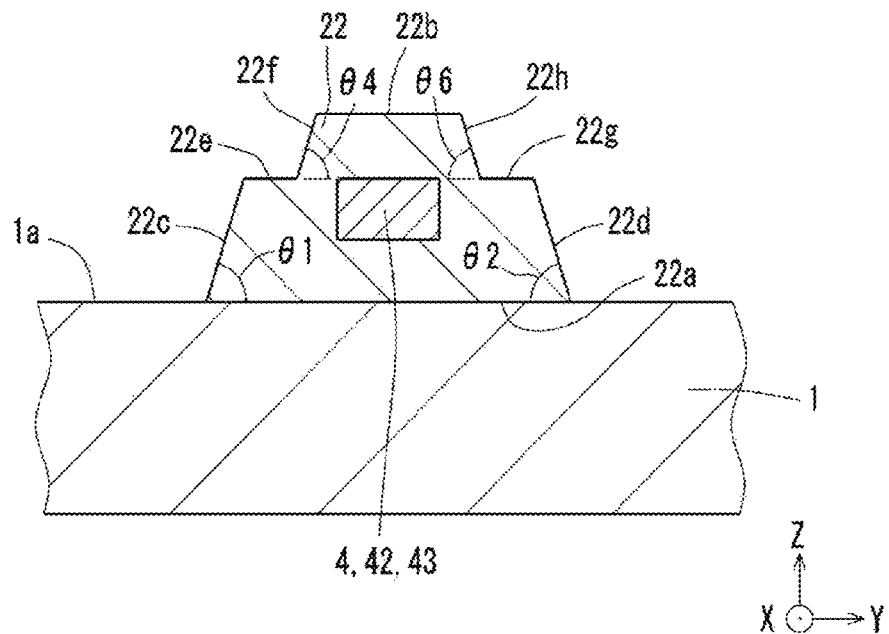
FIG. 7 is an end view of an optical waveguide package according to a variation of the optical waveguide package in FIG. 1.
Figure 8:
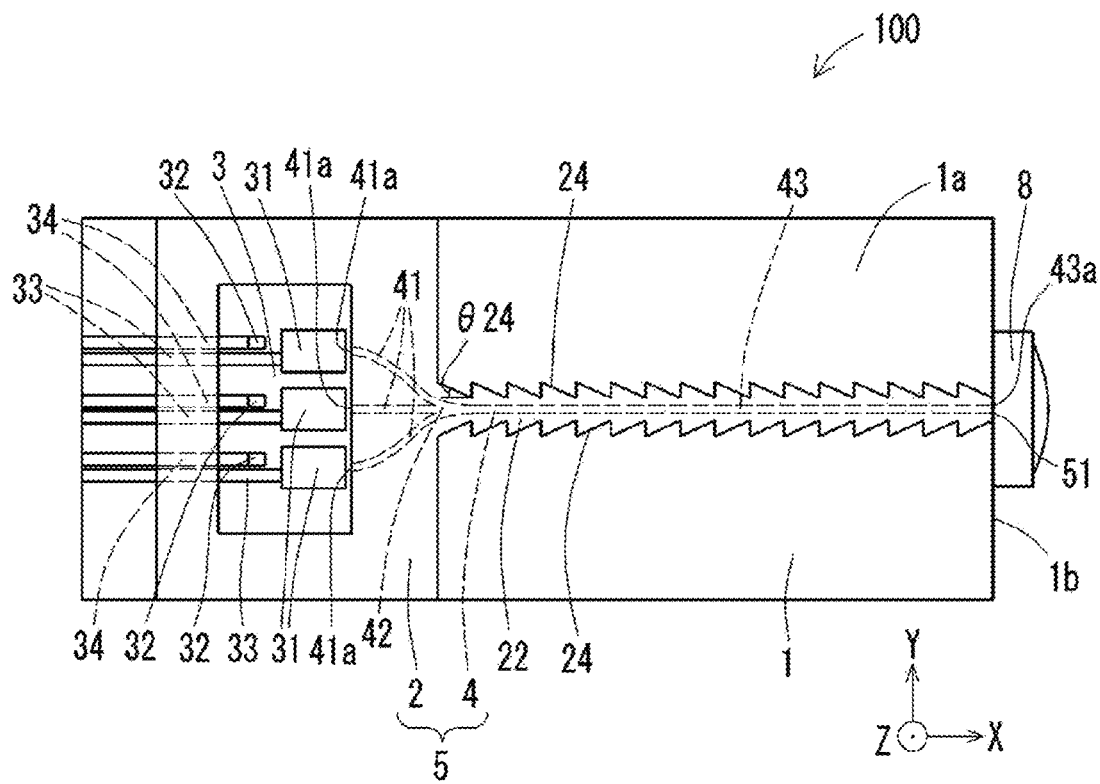
FIG. 8 is a plan view of an optical waveguide package according to a variation of the optical waveguide package in FIG. 1.

FIG. 1 is an exploded perspective view of an optical waveguide package according to one embodiment of the present disclosure. FIG. 2 is an exploded perspective view of the optical waveguide package according to the embodiment of the present disclosure as viewed in a direction different from the direction in FIG. 1. FIG. 3 is a plan view of the optical waveguide package in FIG. 1. FIG. 4 is a cross-sectional view taken along line IV-IV in FIG. 3. FIG. 5 is an end view taken along line V-V in FIG. 3. FIG. 6 is an end view of an optical waveguide package according to a variation of the optical waveguide package in FIG. 1. FIG. 7 is an end view of an optical waveguide package according to a variation of the optical waveguide package in FIG. 1. FIG. 8 is a plan view of an optical waveguide package according to a variation of the optical waveguide package in FIG. 1. In FIGS. 3, 4, and 8, a lid and a loop seal are not illustrated. The end views in FIGS. 6 and 7 correspond to the end view in FIG. 5. The plan view in FIG. 8 corresponds to the plan view in FIG. 3.

In the present embodiment, an optical waveguide package 100 includes a substrate 1, a cladding layer 2, multiple element mount portions 3, and a core 4.

As illustrated in FIGS. 1 to 3, the substrate 1 includes a main surface (first surface) 1a and a side surface 1b continuous with the main surface 1a. The cladding layer 2 is located on the first surface 1a of the substrate 1. As illustrated in FIG. 4, the cladding layer 2 includes a lower surface 2a facing the substrate 1 and an upper surface 2b opposite to the lower surface 2a. The upper surface 2b includes a recess 21. The multiple element mount portions 3 are located in the recess 21. Multiple light emitting elements 10 are mounted on the respective element mount portions 3. The core 4 is located in the cladding layer 2. The core 4 extends from the recess 21 to an outer side surface of the cladding layer 2.

The substrate 1 may be a ceramic wiring board made of a ceramic material. Examples of the ceramic material used for the ceramic wiring board include sintered aluminum oxide, sintered mullite, sintered silicon carbide, sintered aluminum nitride, and sintered glass ceramic. The ceramic wiring board may include conductors such as connection pads, internal wiring conductors, and external connection terminals for electrical connection between the light emitting elements 10 and an external circuit. The ceramic wiring board may be a stack of multiple ceramic layers.

The substrate 1 may be an organic wiring board made of an organic material. The organic wiring board may be a printed wiring board, a build-up wiring board, or a flexible wiring board. Examples of the organic material used for the organic wiring board include an epoxy resin, a polyimide resin, a polyester resin, an acrylic resin, a phenolic resin, and a fluororesin. The organic wiring board may be a single resin layer or may be a stack of multiple resin layers.

The substrate 1 may be made of a compound semiconductor such as gallium nitride (GaN), gallium arsenide (GaAs), or indium phosphorus (InP), or may be made of silicon (Si), germanium (Ge), or sapphire ($Al_2O_3$).

The cladding layer 2 may be made of, for example, quartz ($SiO_2$). The cladding layer 2 may be a stack of layers. The cladding layer 2 may be a stack of a lower cladding layer located on the first surface $1_a$ of the substrate 1 and an upper cladding layer located on the upper surface of the lower cladding layer. The core 4 may be located on the upper surface of the lower cladding layer. The recess 21 may extend through the cladding layer 2 in the height direction (Z-direction).

The element mount portions 3 each include a first electrode pad 31 and a second electrode pad 32. The first electrode pad 31 is connected to a first wiring conductor 33. The second electrode pad 32 is connected to a second wiring conductor 34. The first wiring conductor 33 and the second wiring conductor 34 are located on the first surface 1a and extend from the inside of the recess 21 to the outside of the recess 21. The ends of the first wiring conductor 33 and the second wiring conductor 34 located outside the recess 21 is connected to an external power supply.

The light emitting elements 10 mounted on the element mount portions 3 may be, for example, semiconductor laser diodes (LDs) or light-emitting diodes (LEDs). The multiple light emitting elements 10 may emit light beams of different wavelengths. The light emitting elements 10 may include a red-light emitting element 10r having a peak emission intensity in a red wavelength region (about 600 to 700 nm), a green-light emitting element 10g having a peak emission intensity in a green wavelength region (about 500 to 600 nm), and a blue-light emitting element 10b having a peak emission intensity in a blue wavelength region (about 400 to 500 nm).

The element mount portions 3 may be separate from one another with multiple walls extending in the height direction (Z-direction). The walls may be integral with the cladding layer 2.

The core 4 may be made of, for example, silicon oxynitride (SiON) or silicon oxide ($SiO_X$). In the present embodiment, the optical waveguide package 100 includes the cladding layer 2 made of $SiO_2$ and the core 4 made of SiON. The core 4 has a higher refractive index than the cladding layer 2. The difference of the refractive index between the core 4 and the cladding layer 2 may be, for example, about 0.05 to 0.30. The optical waveguide package 100 includes the core 4 with a higher refractive index surrounded by the cladding layer 2 with a lower refractive index. Light propagating through the core 4 is totally reflected at the boundary between the core 4 and the cladding layer 2 to be confined in the core 4. The core 4 and the cladding layer 2 may be formed with, for example, photolithography and etching used in semiconductor device manufacturing.

The cladding layer 2 and the core 4 are included in an optical waveguide 5 through which light beams emitted from the multiple light emitting elements mounted on the respective element mount portions 3 propagate. As illustrated in FIGS. 1 to 3, the core 4 includes multiple light incident portions 41, a merging portion 42, and a light emission portion 43. The light incident portions 41 each include an incident end face 41a located at an inner side surface of the recess 21. The multiple incident end faces 41a receive light beams emitted from the respective light emitting elements 10. The light incident portions 41 merge in the merging portion 42. The merging portion 42 may be a portion between a contact position at which the adjacent portions (light incident portions 41) of the core 4 are in contact with one another and a constant-width position at which the core 4 has a constant width downstream from the contact position. The light emission portion 43 is located downstream from the merging portion 42, or in other words, downstream from the merging portion 42 in a direction of light propagation. The light emission portion 43 extends in the first direction and includes an emission end face 43a located at an outer side surface of the cladding layer 2. The light emission portion 43 may have a width (dimension in Y-direction) of, for example, about 1 to 10 μm. Light beams emitted from the light emitting elements 10 merge in the merging portion 42 and are emitted through the emission end face 43a. The emission end face 43a of the light emission portion 43 and the outer side surface of the cladding layer 2 including the emission end face 43a are included in an output end 51 of the optical waveguide 5. The output end 51 of the optical waveguide 5 may be flush with the side surface 1b of the substrate 1. In this case, light emitted through the output end 51 is unlikely to hit the first surface 1a. Thus, light propagating through the light emission portion 43 can be output efficiently.

In the optical waveguide package 100, the first surface 1a of the substrate 1 includes an exposed portion at least lateral to the merging portion 42 in a plan view. Being lateral herein refers to being in a direction perpendicular to an extension direction in which the light emission portion 43 extends and parallel to the first surface 1a. The merging portion 42 is a portion in which the multiple light incident portions 41 merge. Light beams propagating through the respective light incident portions 41 change their propagation directions in the merging portion 42 and are likely to leak from the core 4 in the merging portion 42. The optical waveguide package 100, which includes no portion of the cladding layer 2 in an area lateral to the merging portion 42, is likely to release light (hereafter also simply referred to as leaking light) leaking from the core 4 outside. Thus, light leaking from the core 4 is less likely to be stray light that propagates through the cladding layer 2. Although the first surface 1*a* includes an exposed portion lateral to the merging portion 42 and the light emission portion 43 in the example in FIG. 3, the first surface 1*a* may include an exposed portion lateral to the merging portion 42 alone without including an exposed portion lateral to the light emission portion 43.

The optical waveguide package 100, which includes at least a portion of the optical waveguide 5 lateral to the merging portion 42 being narrower, is likely to release light emitted from the light emitting elements 10 and directly entering the cladding layer 2 outside from the narrower portion of the optical waveguide 5. The light emitted from the light emitting elements 10 and directly entering the cladding layer 2 is thus less likely to be emitted through the output end 51 of the optical waveguide 5.

The optical waveguide package 100, which includes no portion of the cladding layer 2 on at least a part of the first surface 1*a*, allows less light (also referred to as external light) to enter the cladding layer 2 from the ambient environment. This can reduce external light to be stray light, which propagates through the cladding layer 2 to be emitted through the output end 51 of the optical waveguide 5.

As described above, the optical waveguide package 100 reduces stray light emitted through the output end 51 of the optical waveguide 5 and allows emitted light to have higher quality.

The cladding layer 2 in the optical waveguide package 100 may be formed by removing a portion of a precursor of the cladding layer 2 extending substantially throughout the first surface 1*a*. The portion of the precursor of the cladding layer 2 to be removed may be removed with photolithography and etching.

As illustrated in FIG. 3, the core 4 includes the light incident portions 41 having curvatures. The optical waveguide package 100 may include an exposed portion of the first surface 1*a* lateral to positions at which the curvatures of the respective light incident portions 41 are greatest. In the example in FIG. 3, a two-dot-dash line L indicates an exposed portion of the first surface 1*a* extending to the portion lateral to the positions at which the curvatures of the respective light incident portions 41 are greatest. Light propagating through the core 4 is more likely to leak to the cladding layer 2 from a position at which the core 4 has a greater curvature. In the optical waveguide package 100, the exposed portion of the first surface 1*a* is located lateral to the position at which light is most likely to leak without no portion of the cladding layer 2 extending across an area lateral to the position. The optical waveguide package 100 is thus likely to release light leaking from the core 4 outside. Thus, light leaking from the core 4 is less likely to be stray light, which propagates through the cladding layer 2 to be emitted through the output end 51 of the optical waveguide 5. This can improve the quality of emitted light.

The multiple light incident portions 41 may have different lengths in their extension direction (in the direction of light propagation). This structure can increase the flexibility in arranging the multiple element mount portions 3 and can reduce the size the optical waveguide package 100. Additionally, this structure decreases the curvatures of the light incident portions 41 and can reduce light leaking from the light incident portions 41.

The optical waveguide package 100 may include an exposed portion of the first surface 1*a* lateral to the merging portion 42 and the light emission portion 43. The merging portion 42 and the light emission portion 43 are located downstream from the light incident portions 41. Thus, light leaking from the light incident portions 41 propagates through the portion of the cladding layer 2 covering the merging portion 42 and the light emission portion 43. With the exposed portion of the first surface 1*a* located lateral to the merging portion 42 and the light emission portion 43, light (stray light) leaking from the light incident portions 41 is likely to be released outside. This can improve the quality of emitted light. Light leaking from the merging portion 42 is more likely to propagate in the positive first direction (rightward in FIG. 3) than in the direction perpendicular to the first direction (X-direction). With the exposed portion of the first surface 1*a* located lateral to the light emission portion 43 and downstream from the merging portion 42, light leaking from the merging portion 42 is less likely to be stray light. This can improve the quality of emitted light.

The cladding layer 2 includes a narrow ridge 22 elongated along the core 4 in a portion lateral to the exposed portion of the first surface 1*a*. As illustrated in FIG. 5, the ridge 22 includes, in a cross section perpendicular to the extension direction (X-direction) of the light emission portion 43, a second surface 22*a* facing the first surface 1*a* of the substrate 1, a third surface 22*b* opposite to the second surface 22*a*, a first side surface 22*c* continuous with the second surface 22*a*, and a second side surface 22*d* opposite to the first side surface 22*c*. In a plan view, the ridge 22 may have a width of about 1.5 to 30 times the width of the core 4 (light emission portion 43).

The first side surface 22*c* and the second side surface 22*d* may be roughened. The first side surface 22*c* and the second side surface 22*d* may each have a greater surface roughness than the third surface 22*b*. This structure allows light leaking from the core 4 to be diffusely reflected at the boundary between the ridge 22 and the outside, thus reducing reentering of light leaking from the core 4 and reducing deterioration in the quality of emitted light. The first side surface 22*c* and the second side surface 22*d* may have an arithmetic mean roughness Ra of about 5 to 100 nm. The third surface 22*b* may have an arithmetic mean roughness Ra of about 0.1 to 10 nm.

As illustrated in FIG. 6, the first side surface 22*c* and the second side surface 22*d* may be inclined with respect to the first surface 1*a*, rather than at 90 degrees with respect to the first surface 1*a*. In this structure, any light leaking from the core 4 and reflected at the boundary between the cladding layer 2 and the outside is less likely to be reflected toward the core 4. This can reduce reentering of light leaking from the core 4 and reduce deterioration in the quality of emitted light. The ridge 22 is tapered upward to have a smaller surface for external light to enter. This effectively reduces external light entering the cladding layer 2, thus effectively reducing external light to be stray light, which propagates through the optical waveguide 5 to be emitted through the output end 51 of the optical waveguide 5. The ridge 22 tapering upward allows stress generated between the ridge 22 and the substrate to disperse easily, improving the bonding reliably with the substrate 1. The first side surface 22*c* may be inclined with respect to the first surface 1*a* at an inclination angle θ1 greater than or equal to 70 degrees and less than 90 degrees. The second side surface 22*d* may be inclined with respect to the first surface 1*a* at an inclination angle θ2 greater than or equal to 70 degrees and less than 90 degrees. In this case, photolithography and etching may be used to form the first side surface 22*c* and the second side surface 22*d* easily. The inclination angle θ1 and the inclination angle θ2 may be the same or different.

As illustrated in FIG. 7, the ridge 22 may include a third side surface 22e continuous with the first side surface 22c, a fourth side surface 22f connecting the third side surface 22e and the third side surface 22b, a fifth side surface 22g continuous with the second side surface 22d, and a sixth side surface 22h connecting the fifth side surface 22g and the third surface 22b. In this structure, the ridge 22 has more corners, with the side surfaces of the ridge 22 having various angles with the first surface 1a. Thus, any light leaking from the core 4 and reflected at the boundary between the cladding layer 2 and the outside is less likely to be reflected toward the core 4. Light leaking from the core 4 is thus less likely to reenter the core 4, allowing emitted light to have higher quality.

The fourth side surface 22f and the sixth side surface 22h may be inclined with respect to the first surface 1a. The fourth side surface 22f may be inclined with respect to the first surface 1a at an inclination angle θ4 that is greater than the inclination angle θ1 and the inclination angle θ2. The sixth side surface 22h may be inclined with respect to the first surface 1a at an inclination angle θ6 that is greater than the inclination angle θ1 and the inclination angle θ2. The inclination angle θ4 and the inclination angle θ6 may be greater than or equal to 70 degrees and less than 90 degrees. In this case, photolithography and etching may be used to form the fourth side surface 22f and the sixth side surface 22h easily. The third side surface 22e and the fifth side surface 22g may be substantially parallel to the first surface 1a of the substrate 1. The third side surface 22e and the fifth side surface 22g may each have a height that is the same as or different from the height of the first surface 1a.

The fourth side surface 22f and the sixth side surface 22h may be roughened. The fourth side surface 22f and the sixth side surface 22h may each have a greater surface roughness than the third surface 22b. This structure allows light leaking from the core 4 to be diffusely reflected at the boundaries between the fourth side surface 22f and the outside and between the sixth side surface 22h and the outside. This can reduce reentering of light leaking from the core 4 and reduce deterioration in the quality of emitted light. The fourth side surface 22f and the sixth side surface 22h may have an arithmetic mean roughness Ra of about 5 to 100 nm.

The light emission portion 43 may be located adjacent to a corner of the profile of the ridge 22 in a cross section perpendicular to the extension direction (X-direction) of the light emission portion 43. In this structure, any light leaking from the core 4 and reflected at the boundary between the cladding layer 2 and the outside is less likely to be reflected toward the core 4. Light leaking from the core 4 is thus less likely to reenter the core 4, allowing emitted light to have higher quality.

In a plan view, the ridge 22 may include, on its side surface, at least one portion (also referred to as an acute angle surface) 24 that is closer to the core 4 toward the emission end face 43a and forms an acute angle with respect to an extension direction in which the core 4 extends. In other words, the ridge 22 may include the acute angle surface 24 on its side surface. Any leaking light entering the boundary between the acute angle surface 24 and the outside can have a smaller angle of incidence than leaking light entering the boundary between a portion of the cladding layer 2 other than the acute angle surface 24 and the outside. In other words, leaking light incident on the side surface being the acute angle surface 24 can enter the boundary between the side surface of the core 4 and the outside at a smaller angle of incidence than leaking light incident on a side surface of the ridge 22 extending parallel to the core 4. Thus, leaking light is less likely to be reflected at the boundary between the acute angle surface 24 and the outside and is more likely to be released outside. This can reduce stray light in the optical waveguide 5, improving the quality of emitted light.

The acute angle surface 24 may have an inclination angle θ24, or in other words, an inclination angle θ24 of the acute angle surface 24 with respect to the extension direction (X-direction) of the core 4, that is set as appropriate for the emission angle of leaking light. The inclination angle θ24 may be, for example, 15 to 75 degrees. Leaking light is emitted at an acute angle with respect to the extension direction (X-direction). With the acute inclination angle θ24, the leaking light can enter the boundary between the acute angle surface 24 and the outside at an angle of incidence of 0 degrees or close to 0 degrees.

The acute angle surface 24 may be at the same height as the core 4 from the first surface 1a and may be lateral to the core 4. The acute angle surface 24 may include a lower end below the lower end of the core 4 and an upper end above the upper end of the core 4. This structure can effectively reduce stray light in the optical waveguide 5 and can effectively improve the quality of emitted light.

At least one acute angle surface 24 may be located lateral to the merging portion 42 in the ridge 22. Stray light of lower intensity can occur at other positions as well. Thus, as illustrated in FIG. 8, multiple acute angle surfaces 24 may be located throughout the ridge 22 in the length direction (X-direction) to collectively define a saw-tooth shape. As illustrated in FIG. 8, the acute angle surfaces 24 may be located on both ends of the ridge 22 in the second direction (Y-direction). The multiple acute angle surfaces 24 on the ridge 22 can effectively reduce stray light in the optical waveguide 5 and can effectively improve the quality of emitted light.

The optical waveguide package 100 may further include a lid 6, a loop seal 7, and a condenser lens 8.

The lid 6 is located on the upper surface 2b of the cladding layer 2 and closes the opening of the recess 21. The lid 6 may be directly bonded to the cladding layer 2 or may be bonded to the cladding layer 2 with the loop seal 7 between the lid 6 and the cladding layer 2 as illustrated in FIG. 1. The loop seal 7 is looped and surrounds the opening of the recess 21 in a plan view. The loop seal 7 can improve the airtightness of the space accommodating the light emitting elements 10.

The lid 6 may be directly bonded to the cladding layer 2 through, for example, heat bonding. However, the cladding layer 2 and the core 4 may deform under stress during bonding. This may cause misalignment of the optical axes between the light emitting elements 10 and the core 4. With the loop seal 7 surrounding the opening of the recess 21, a portion of the cladding layer 2 close to the recess 21 can have higher mechanical strength. This can reduce deformation of the cladding layer 2 and the core 4 and misalignment of the optical axes between the light emitting elements 10 and the core 4.

The lid 6 may be made of, for example, a glass material such as quartz, borosilicate glass, or sapphire. The lid 6 may be made of, for example, a metal material such as Fe, Ni, or Co or an alloy material containing any of these metals. The loop seal 7 may be made of, for example, a metal material such as Ti, Ni, Au, Pt, or Cr or an alloy material containing any of these metals. The loop seal 7 may be fixed to the upper surface 2b of the cladding layer 2 by, for example, vapor deposition, sputtering, ion plating, or plating. The lid 6 may be bonded to the loop seal 7 with a bond such as Au—Sn or Sn—Ag—Cu solder, a metal nanoparticle paste of, for example, Ag or Cu, or a glass paste.

The condenser lens 8 is located on the optical path of light emitted through the emission end face 43a. The condenser lens 8 may collimate light emitted through the emission end face 43a or condense light emitted through the emission end face 43a. As illustrated in FIG. 4, the condenser lens 8 may be a plano-convex lens with a flat incident surface facing the emission end face 43a and a convex emission surface.

The optical waveguide package 100 may further include multiple first wiring conductors and multiple second wiring conductors located on the first surface 1a of the substrate 1. Each first wiring conductor includes one end connected to the corresponding first electrode pad and the other end extending outside the recess 21. Each second wiring conductor includes one end connected to the corresponding second electrode pad and the other end extending outside the recess 21. The other ends of the first wiring conductors and the other ends of the second wiring conductors are electrically connected to an external power supply circuit.

Figure 9:
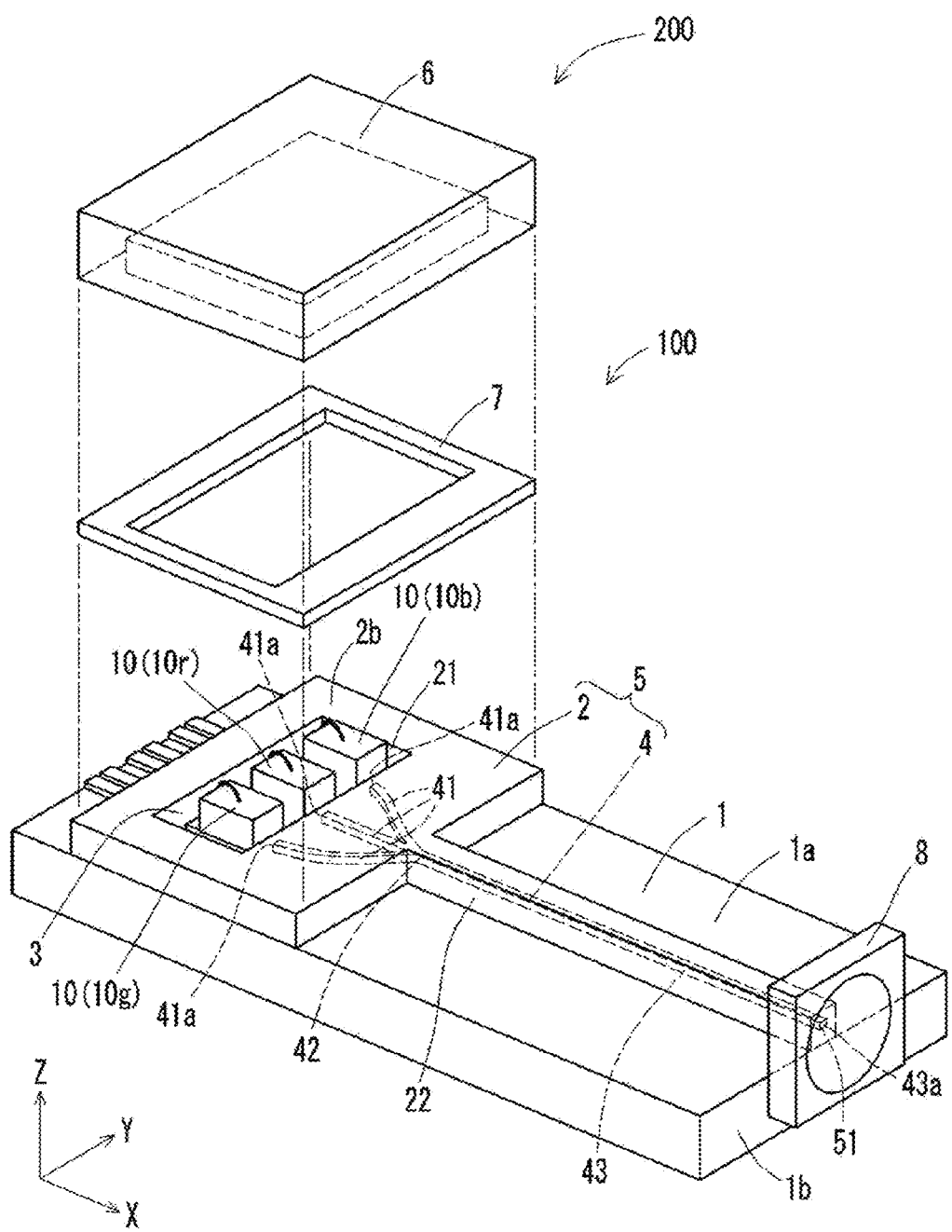
FIG. 9 is an exploded perspective view of a light source module according to one embodiment of the present disclosure.

A light source module according to one embodiment of the present disclosure will now be described. FIG. 9 is an exploded perspective view of the light source module according to the embodiment of the present disclosure.

In the present embodiment, a light source module 200 includes the optical waveguide package 100 and the multiple light emitting elements 10. The light emitting elements 10 may include the red-light emitting element 10r, the green-light emitting element 10g, and the blue-light emitting element 10b. As illustrated in FIG. 9, the light emitting elements 10 are mounted on the respective element mount portions 3 in the optical waveguide package 100. For the light emitting elements 10 each including a first electrode on its lower surface and a second electrode on its upper surface, the first electrodes are electrically connected to the respective first electrode pads 31 through conductive bonds, and the second electrodes are electrically connected to the respective second electrode pads 32 through connection members such as bonding wires.

Although the green-light emitting element 10g, the red-light emitting element 10r, and the blue-light emitting element 10b are arranged in this order in the second direction (Y-direction) in the example in FIG. 9, the light emitting elements 10 may be arranged in any order. Although the light emitting elements 10 are arranged to emit light beams in directions parallel to one another in the example in FIG. 9, the light emitting elements 10 may be arranged to emit light beams in directions nonparallel to one another.

In the present embodiment, the light source module 200 including the optical waveguide package 100 can emit light with high quality.

Figure 10:
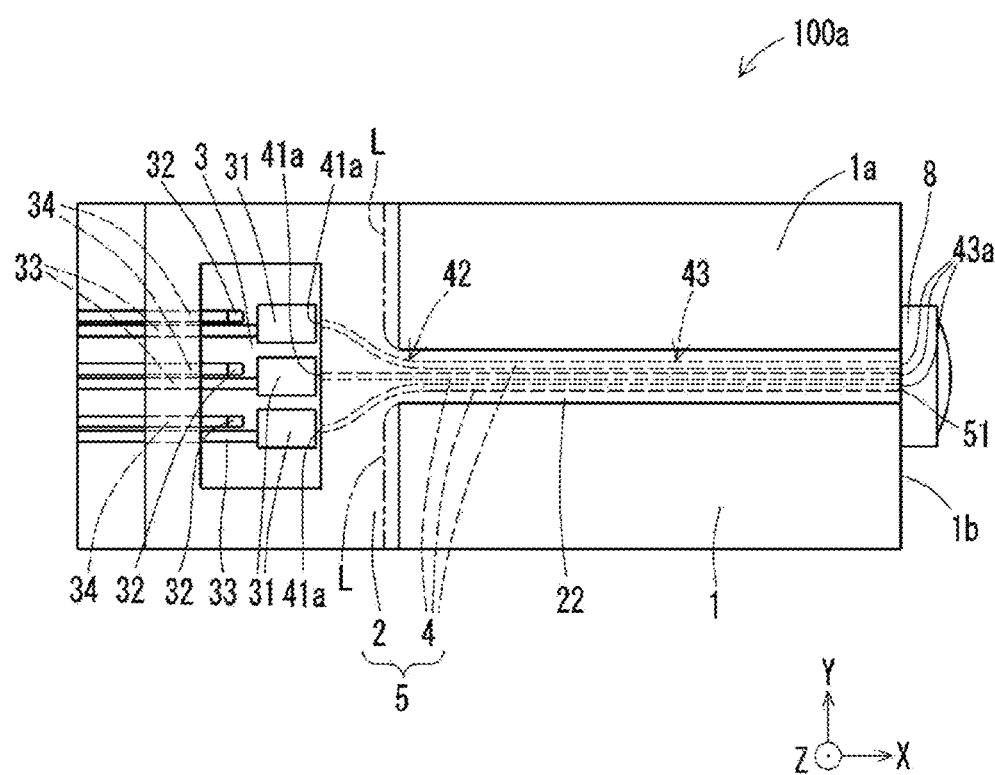
FIG. 10 is a plan view of an optical waveguide package according to another embodiment of the present disclosure.

FIG. 10 is a plan view of a light-emitting device according to another embodiment of the present disclosure. Like reference numerals denote the corresponding components in the above embodiment. Such components are not described repeatedly. In the embodiment described above with reference to FIG. 3, the core 4 includes three branching paths 41 and one joined path including the merging portion 42 in which the three branching paths 41 merge into the light emission portion 43 with one emission end face 43a. In the present embodiment, the light-emitting device including an optical waveguide package 100a includes optical channels for guiding light beams of different wavelengths individually. In the present embodiment, the light-emitting device includes three cores 4 that guide light beams of different wavelengths individually as in the example illustrated in the plan view in FIG. 10. As in the embodiments described above, the three incident end faces 41a are located apart from one another to correspond to the positions of the respective light emitting elements 10, with the centers of the incident end faces 41a of the cores 4 aligned with the optical axes of the respective light emitting elements 10. In the present embodiment, the emission end faces 43a of the cores 4 are adjacent to one another. Light beams emitted through the respective emission end faces 43a merge in, for example, the lens 8 after traveling through a merging section extending between the incident end faces 41a and the emission end faces 43a in which the three cores 4 are gathered adjacent to one another and extend parallel to one another. The cores 4 may not be parallel to one another and may be substantially parallel to one another with the distances between them decreasing toward the output end. The cores 4 may bend greatly and be adjacent to one another before extending substantially parallel to one another toward the output end. In this structure, the distances between the adjacent cores 4 may decrease toward the output end. Merged light emitted through the lens 8 is divided by a downstream branching filter. As in the embodiment described above, when the separate three cores 4 are parallel to one another and are in contact with or adjacent to one another, the closely adjacent cores 4 have light coupling and substantially serve as a merging portion. Light beams emitted from the cores 4 may be emitted parallel to one another through, for example, one condenser lens 8. In this case, for example, images resulting from the light beams emitted through the three emission end faces 43a may be combined by, for example, an external device.

In FIG. 10, the merging portion 42 is a portion in which a core 4 bends to approach another adjacent core 4 to be parallel to each other. More specifically, in FIG. 10, the merging portion 42 extends from a position at which the cores 4 bend to be parallel to the linear core 4 to a position at which the cores 4 are parallel to one another. The light emission portion 43 is a portion in which the cores 4 extend parallel to one another. In the present embodiment, although the cores 4 do not actually merge in the merging portion, the cores 4 gather adjacent to one another as the merging portion.

The optical waveguide package according to one or more embodiments of the present disclosure may be implemented in forms 1 to 9 described below.

(1) An optical waveguide package, comprising:
    a substrate including a first surface;
    a cladding layer on the first surface, the cladding layer including a facing surface facing the first surface and an opposite surface opposite to the facing surface, the opposite surface including a recess;
    a plurality of element mount portions in the recess; and
    a core in the cladding layer, the core including a plurality of light incident portions each including an incident end face located at an inner side surface of the recess, a merging portion in which the plurality of light incident portions merge, and a light emission portion located downstream from the merging portion and including an emission end face located at an outer side surface of the cladding layer,
    wherein the first surface incudes an exposed portion at least lateral to the merging portion in a plan view.

(2) The optical waveguide package according to (1), wherein
    the plurality of light incident portions in the core has curvatures, and the first surface includes an exposed portion lateral to positions at which the curvatures of the respective plurality of light incident portions are greatest.

(3) The optical waveguide package according to (1) or (2), wherein the first surface includes an exposed portion lateral to the merging portion and the light emission portion.

(4) The optical waveguide package according to (1) or (2), wherein a portion of the cladding layer lateral to the exposed portion of the first surface includes, in a cross section perpendicular to an extension direction in which the light emission portion extends, a second surface facing the first surface, a third surface opposite to the second surface, a first side surface continuous with the second surface, and a second side surface continuous with the second surface and opposite to the first side surface, and each of the first side surface and the second side surface is inclined with respect to the first surface.

(5) The optical waveguide package according to (4), wherein each of the first side surface and the second side surface has a greater surface roughness than the third surface.

(6) The optical waveguide package according to (4) or (5), wherein the portion of the cladding layer includes, in a cross section perpendicular to the extension direction, a third side surface continuous with the first side surface, a fourth side surface connecting the third side surface and the third surface, a fifth side surface continuous with the second side surface, and a sixth side surface connecting the fifth side surface and the third surface.

(7) The optical waveguide package according to (6), wherein the first side surface and the fourth side surface are nonparallel to the third side surface, and the second side surface and the sixth side surface are nonparallel to the fifth side surface.

(8) The optical waveguide package according to any one of (4) to (7), wherein the portion of the cladding layer includes at least one portion being closer to the core toward the emission end face in a plan view.

(9) The optical waveguide package according to any one of (1) to (8), further comprising:

a lid closing an opening of the recess; and a condenser lens on an optical path of light emitted through the emission end face.

The light source module according to one or more embodiments of the present disclosure may be implemented in form 10 described below.

(10) A light source module, comprising:

the optical waveguide package according to any one of (1) to (9); and a plurality of light emitting elements each mounted on a corresponding element mount portion of the plurality of element mount portions.

In one or more embodiments of the present disclosure, the optical waveguide package reduces stray light emitted through the output end of the optical waveguide and allows emitted light to have higher quality. In one or more embodiments of the present disclosure, the light source module including the optical waveguide package described above can emit light with high quality.

Although one or more embodiments of the present disclosure have been described in detail, the present disclosure is not limited to the embodiments described above, and may be changed or varied in various manners without departing from the spirit and scope of the present disclosure. The components described in the above embodiments may be entirely or partially combined as appropriate unless any contradiction arises.

REFERENCE SIGNS 100, 100a optical waveguide package
200 light source module
1 substrate
1a main surface
1a first surface
1b side surface
2 cladding layer
2a lower surface
2b upper surface
21 recess
22 ridge
22a second surface
22b third surface
22c first side surface
22d second side surface
22e third side surface
22f fourth side surface
22g fifth side surface
22h sixth side surface
24 acute angle surface
3 element mount portion
31 first electrode pad
32 second electrode pad
33 first wiring conductor
34 second wiring conductor
4 core
41 light incident portion
41a incident end face
42 merging portion
43 light emission portion
43a emission end face
5 optical waveguide
51 output end
6 lid
7 loop seal
8 condenser lens
10, 10r, 10g, 10b light emitting element

The invention claimed is:

1. An optical waveguide package, comprising:
a substrate including a first surface;
a cladding layer on the first surface, the cladding layer including a facing surface facing the first surface and an opposite surface opposite to the facing surface, the opposite surface including a recess;
a plurality of element mount portions in the recess; and
a core in the cladding layer, the core including a plurality of light incident portions each including an incident end face located at an inner side surface of the recess, a merging portion in which the plurality of light incident portions merge, and a light emission portion located downstream from the merging portion and including an emission end face located at an outer side surface of the cladding layer,
wherein the first surface incudes an exposed portion at least lateral to the merging portion in a plan view.

2. The optical waveguide package according to claim 1, wherein the plurality of light incident portions in the core has curvatures, and the first surface includes an exposed portion lateral to positions at which the curvatures of the respective plurality of light incident portions are greatest.

3. The optical waveguide package according to claim 1, wherein the first surface includes an exposed portion lateral to the merging portion and the light emission portion.

4. The optical waveguide package according to claim 1, wherein a portion of the cladding layer lateral to the exposed portion of the first surface includes, in a cross section perpendicular to an extension direction in which the light emission portion extends, a second surface facing the first surface, a third surface opposite to the second surface, a first side surface continuous with the second surface, and a second side surface continuous with the second surface and opposite to the first side surface, and each of the first side surface and the second side surface is inclined with respect to the first surface.

5. The optical waveguide package according to claim 4, wherein each of the first side surface and the second side surface has a greater surface roughness than the third surface.

6. The optical waveguide package according to claim 4, wherein the portion of the cladding layer includes, in a cross section perpendicular to the extension direction, a third side surface continuous with the first side surface, a fourth side surface connecting the third side surface and the third surface, a fifth side surface continuous with the second side surface, and a sixth side surface connecting the fifth side surface and the third surface.

7. The optical waveguide package according to claim 6, wherein the first side surface and the fourth side surface are nonparallel to the third side surface, and the second side surface and the sixth side surface are nonparallel to the fifth side surface.

8. The optical waveguide package according to claim 4, wherein the portion of the cladding layer includes at least one portion being closer to the core toward the emission end face in a plan view.

9. The optical waveguide package according to claim 1, further comprising:

a lid closing an opening of the recess; and a condenser lens on an optical path of light emitted through the emission end face.

10. A light source module, comprising:

the optical waveguide package according to claim 1; and a plurality of light emitting elements each mounted on a corresponding element mount portion of the plurality of element mount portions.

* * * * *